US006922100B2

(12) United States Patent
Midya et al.

(10) Patent No.: US 6,922,100 B2
(45) Date of Patent: Jul. 26, 2005

(54) METHOD AND APPARATUS FOR SWITCHING AMPLIFICATION HAVING VARIABLE SAMPLE POINT AND VARIABLE ORDER CORRECTION

(75) Inventors: Pallab Midya, Palatine, IL (US); Steven W. Bergstedt, Schaumburg, IL (US); William J. Roeckner, Carpentersville, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/629,203

(22) Filed: Jul. 29, 2003

(65) Prior Publication Data

US 2005/0024133 A1 Feb. 3, 2005

(51) Int. Cl.[7] .................................................. H03F 3/38

(52) U.S. Cl. ..................................... 330/10; 330/207 A

(58) Field of Search ............................... 330/10, 207 A, 330/251; 332/109; 363/41; 275/238

(56) References Cited

U.S. PATENT DOCUMENTS

| | | | | |
|---|---|---|---|---|
| 6,414,613 B1 | | 7/2002 | Midya et al. | 341/143 |
| 6,466,087 B2 | * | 10/2002 | Ruha | 330/10 |
| 6,504,427 B2 | | 1/2003 | Midya et al. | 330/10 |
| 6,549,085 B1 | | 4/2003 | Wagh et al. | 332/109 |
| 6,768,779 B1 | * | 7/2004 | Nielsen | 330/10 |
| 2003/0042976 A1 | | 3/2003 | Midya et al. | 330/10 |

* cited by examiner

*Primary Examiner*—Khanh V. Nguyen
(74) *Attorney, Agent, or Firm*—Fulbright & Jaworski, LLP

(57) ABSTRACT

Disclosed is a method and/or apparatus for adjusting the sample time and order associated with a digital correction system for maximizing output power and minimizing power stage delay sensitivity of a switching power stage. In certain embodiments, the sample point of an ADC may be changed as a function of the duty ratio of the PWM signal thus allowing higher performance and use of less expensive power stage components. In addition, adjustment of the order of an integrating error amplifier in the system permits operation of the power stage with an output being permitted to saturate up to the power supply rails, thus increasing a power output of the power stage.

15 Claims, 6 Drawing Sheets

METHOD AND APPARATUS FOR SWITCHING AMPLIFICATION HAVING VARIABLE SAMPLE POINT AND VARIABLE ORDER CORRECTION

BACKGROUND OF THE INVENTION

1. Field of the Invention

The invention relates generally to switching amplifiers, and more specifically, to error correction in switching amplifiers.

2. Background of the Invention

Digital audio switching power amplifiers are well known and widely used, for example, in the automotive audio industry. In such amplifiers, a digital audio signal which has been pulse width modulated is applied to a switching power amplifier which drives a load, typically a speaker, to reproduce an audio signal represented by the pulse width modulated signal.

The audio fidelity of such high efficiency switching amplifiers is typically determined by the non-idealities of the switching power stage. Additionally, digital audio switching power amplifiers that do not incorporate feedback suffer from poor power supply rejection. Prior attempts to improve fidelity and power supply rejection in light of these non-idealities have proposed incorporating a feedback mechanism to digitally correct the distortion introduced by these non-idealities. However, the existing digital correction limits the input signal dynamic range, thus reducing the maximum power produced by the switching amplifier. In addition, with such existing digital correction, if the power stage delay becomes too large, then the feedback system may become difficult to stabilize.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings. In the drawings, like reference numerals (if they occur in more than one view) designate the same or similar elements. The invention may be better understood by reference to one or more of these drawings in combination with the description presented herein. It should be noted that the features illustrated in the drawings are not necessarily drawn to scale.

FIG. 10 is a block diagram of an error amplifier saturation detector, in accordance with an aspect of the present invention; and.

DETAILED DESCRIPTION

The invention and the various features and advantageous details thereof are explained more fully with reference to the nonlimiting embodiments that are illustrated in the accompanying drawings and detailed in the following description. It should be understood that the detailed description and the specific examples, while indicating specific embodiments of the invention, are given by way of illustration only and not by way of limitation. Various substitutions, modifications, additions and/or rearrangements within the spirit and/or scope of the underlying inventive concept will become apparent to those of ordinary skill in the art from this disclosure.

The invention may include a method and/or apparatus for a dual output voltage regulator.

In accordance with one aspect of the invention, a switching power amplifier is presented, including, a power stage having an input and an output, the output providing an amplified pulse modulated output signal, and a digital correction circuit having a first input for receiving a pulse modulated input signal, a second input coupled to the output of the power stage, and an output coupled to the input of the power stage, the digital correction circuit providing a corrected pulse modulated signal to the input of the power stage that has been corrected as a function of a duty ratio of said pulse modulated input signal.

In accordance with another aspect of the invention a multiple-order controllable error amplifier is used in the digital correction circuit, the error amplifier having a first input for receiving a digital pulse width modulated reference input signal, a second input coupled to the output of the power stage, and an output providing an error signal which is used to produce the pulse modulated signal that is input to the power stage. In addition, an order control unit is coupled to receive the error signal and operates to sense a saturation state of the error amplifier, and to adjust an order of the error amplifier as a function of the saturation state.

These and other aspects and features solve the above-noted deficiencies in the prior art, and provide higher performance and the use of less expensive power stage components. In addition, adjustment of the order of the integrating error amplifier permits operation of the power stage with an output swing up to the power supply rails, thus increasing a power output of the power stage.

Figure 1:
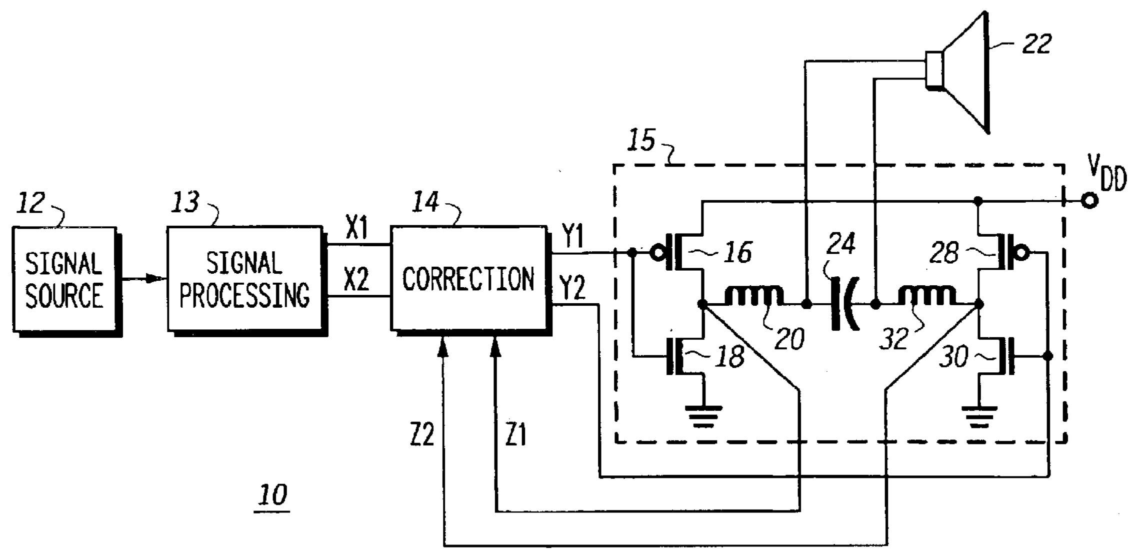
FIG. 1 is a block diagram of a switching power amplifier incorporating an exemplary embodiment of the present invention.

Referring now to FIG. 1, a block diagram of a switching power amplifier with variable sample point and variable order correction is disclosed. The switching amplifier 10 functions to amplify signal source 12 which is conditioned by signal processing unit 13 and variable sample point variable order digital correction block 14. It will be understood that, although the particular illustrated embodiment is an audio amplifier, and thus signal source 12 is an audio signal source, the present invention is also applicable to other forms of signal amplification including, for example, a motor control signal, or the like. It should also be noted that when signal source 12 is an audio signal source, it may be any type of signal source that may be used to produce an audio signal including, for example, an audio recording from a record, compact disc (CD) or magnetic disc, a received radio signal, a received television audio signal, an internet audio signal, or any other type of audio signal.

The output of source 12 is applied to signal processing unit 13 which produces a digital pulse width modulated signal representation of signal source 12, in a known manner. In the disclosed exemplary embodiment, the output of signal processing unit 13 takes the form of two digital signals X1 and X2, with signal X2 being an inverted and delayed signal derived in a known manner from signal X1. The output of signal processing unit 13 is applied to variable sample point variable order digital correction unit 14 which provides a corrected pulse width modulated signals Y1, Y2 for application to the power stage 15 of switching power amplifier 10. Outputs Y1 and Y2 of correction unit 14 are corrected versions of output signals X1 and X2 produced by signal processing unit 13.

Power stage 15 of switching amplifier 10 is illustrated in FIG. 1 as a full bridge amplifier having a particular configuration, however, other types of full bridge amplifiers are acceptable. In addition, while the disclosed embodiment for power stage 15 is a full bridge amplifier, it will be understood that a half bridge amplifier embodiment are also acceptable.

When power stage 15 is a full bridge amplifier, it will typically be constructed using two half bridge amplifiers. In that case, signal Y1 is coupled to drive one of the half bridges, and signal Y2 is coupled to drive the other half bridge. In the disclosed embodiment, transistors 16 and 18 form one half of the full bridge, and transistors 28 and 30 form the other half of the full bridge. Amplifier output signals Z1 and Z2 are sensed and are coupled to correction unit 14 to provide feedback.

In the disclosed exemplary full bridge embodiment, output Y1 of correction unit 14 is connected to a P-channel transistor 16 and an N-channel transistor 18 which together form a first half bridge of power stage 15. In the illustrated form, P-channel transistor 16 has a source connected to a positive power supply terminal labeled $V_{DD}$. A gate of transistor 16 is connected to both a gate of N-channel transistor 18 and to the output of unit 14. A drain of transistor 16 is connected to a drain of N-channel transistor 18. A source of N-channel transistor 18 is connected to a ground or a voltage reference terminal. The drains of transistors 16 and 18 are connected to a first terminal of an inductor 20. A second terminal of inductor 20 is connected to a first terminal of a load, for example, speaker 22, and to a first terminal of capacitor 24. A second terminal of speaker 22 is connected to a second terminal of capacitor 24.

The Y2 output of correction unit 14 is connected to a P-channel transistor 28 and an N-channel transistor 30 which together form a second half bridge of power stage 15. The Y2 output is connected to a gate of each of transistors 28 and 30. Transistor 28 has a source electrode connected to the power supply terminal, $V_{DD}$. A drain of transistor 28 is connected to a drain of transistor 30 and to a first terminal of inductor 32. A source of transistor 30 is connected to the ground reference terminal. A second terminal of inductor 32 is connected to the second terminal of speaker 22 and to the second electrode of capacitor 24.

Signal Z1 is sensed as a first output of power stage 15 at the junction of transistors 16 and 18 and inductor 20. Signal Z2 is sensed as a second output of power stage 15 at the junction of transistors 28 and 30 and inductor 32.

It should be appreciated that various elements of switching amplifier 10 may be incorporated into a single integrated circuit depending upon design choice. For example, the full bridge amplifier formed by transistors 16, 18, 28, and 30 of power stage 15 may be incorporated into an integrated circuit along with units 13 and 14, depending upon the power requirements of a particular application. For particularly high wattage outputs, it may be desirable to implement transistors 16, 18, 28, and 30 as discrete power devices.

It will also be understood that power stage 15 formed by transistors 16, 18, 28, and 30 may be implemented by other circuitry and other circuit techniques than the devices illustrated. The type of switching amplifier chosen depends on the voltage ranges to be used and the particular product application. In operation, signal source 12 provides a signal to signal processing unit 13 which produces modulated reference signals X1 and X2.

Signal processing unit 13 functions to take the signal produced by signal source 12 and to perform a modulation conversion to convert the signal produced by source 12 into a digital pulse modulated signal. In the event that the audio signal is already in pulse modulated form, then signal processing unit 13 may possibly be eliminated and no modulation conversion technique may be required.

Figure 5:
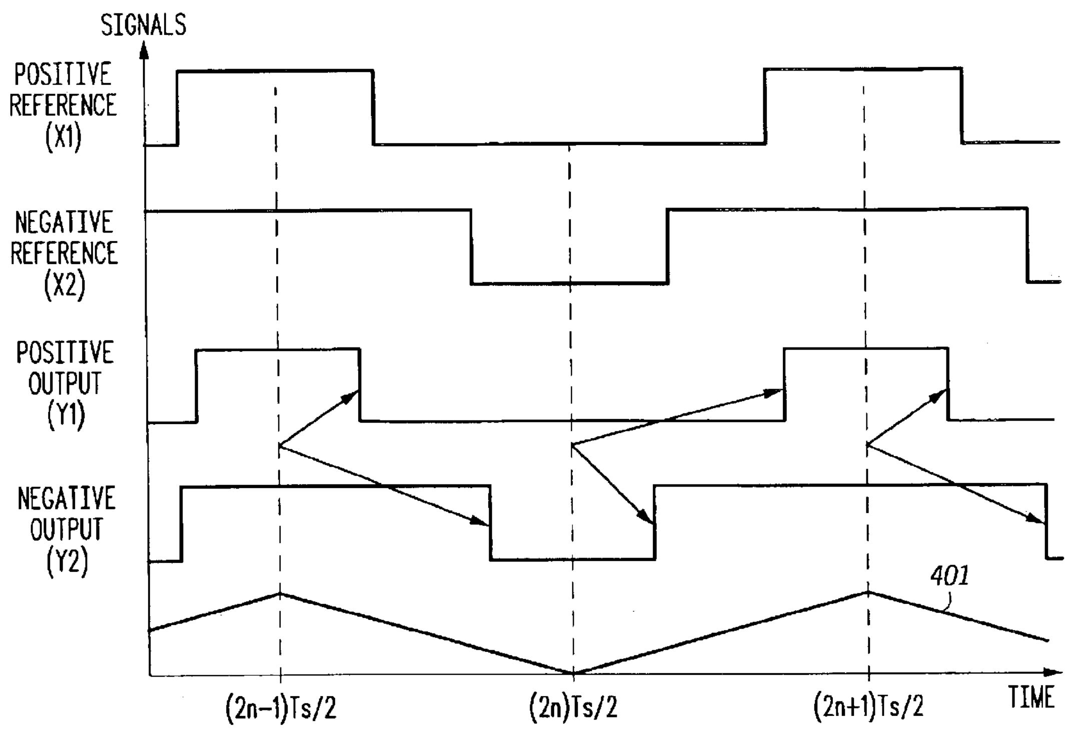
Figure 6:
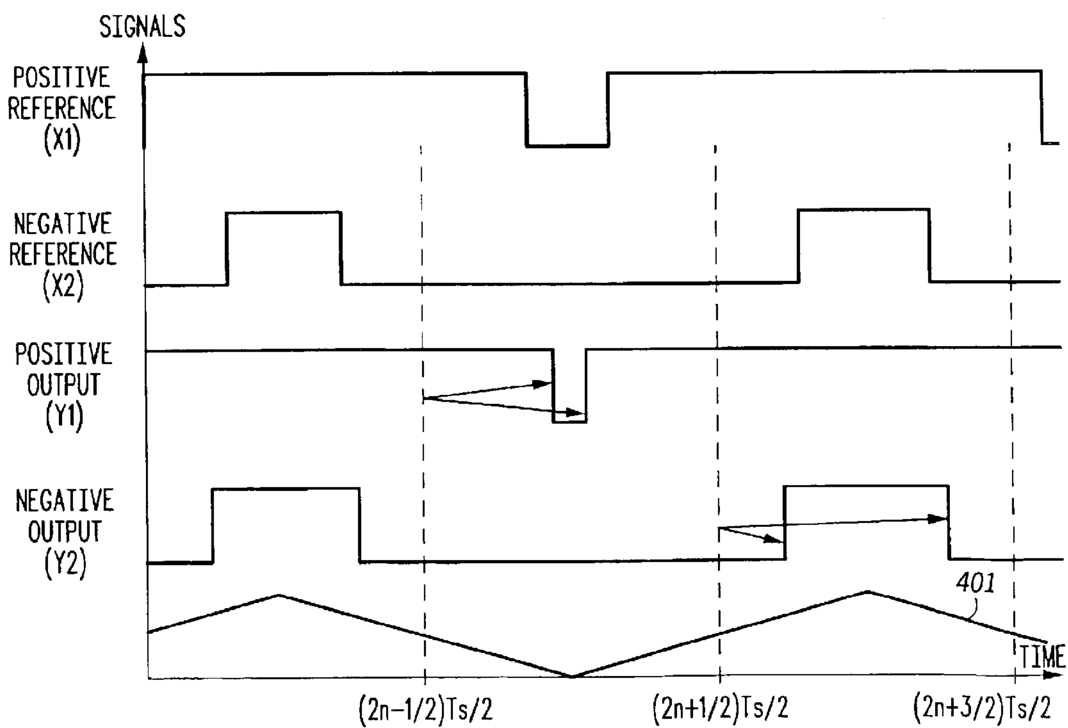

Variable sample point variable order digital correction unit 14 may modify a sampling point, as described in more detail below with reference to FIGS. 4–6, in order to produce corrected signals Y1 and Y2 from reference signals X1 and X2.

Signal processing unit 13 provides a pulse width modulated (PWM) signal at a predetermined clock rate having a corresponding switching period, $T_s$, that functions as a switching signal. The PWM switching signal is conditioned by correction unit 14 and applied to transistors 16, 18, 28 and 30.

Therefore, each pulse of signal Y2 has substantially the same pulse width as a corresponding pulse of the signal Y1, but inverted and delayed in time. The outputs of transistors 16, 18, 28, and 30 are applied to a low pass filter formed by inductors 20 and 32 and capacitor 24 which together form a conventional passive LC network.

Figure 2:
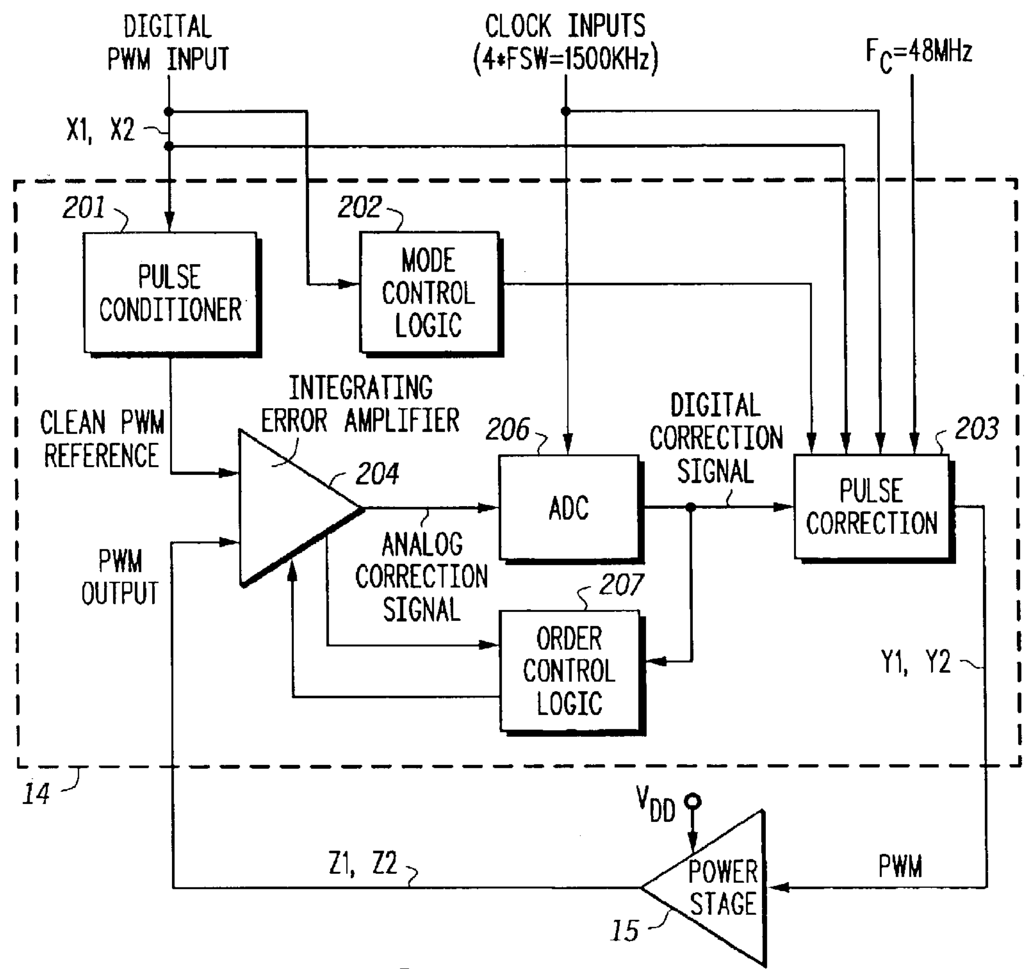
FIG. 2 is a more detailed block diagram of a switching power amplifier, in accordance with an exemplary embodiment of the present invention.

Turning now to FIG. 2, disclosed is a further detail of one implementation of the switching power amplifier including digital correction circuit 14 of FIG. 1. Digital pulse modulated input, in the form of reference signals X1, X2, is connected to an input digital pulse conditioner 201, mode control logic 202, and as a first input to digital pulse edge corrector 203. In one form, the digital pulse modulated input signal X1, X2 is a digital PWM input signal, possibly including a differential mode PWM signal, however, other types of digital pulse modulated signals may also be used. An output of the digital pulse conditioner 201 is a clean PWM reference, and is applied as a first input to integrating error amplifier 204. The output of integrating error amplifier 204 is an analog correction signal, and is applied to an input of analog-to-digital converter (ADC) 206. The output of ADC 206 is a digital correction signal, and is provided as a second input to digital pulse edge corrector 203. A first clock signal is connected to a clock input of ADC 206 and to a first clock input to digital pulse edge corrector 203 for providing a clock having a frequency four times the switching frequency, $F_{sw}$ ($1/T_s$). In one embodiment, the switching frequency, $F_{sw}$, is 375 kHz, which results in ADC 206 having a sampling frequency of 1500 kHz. A second clock signal is connected to a second clock input of digital pulse edge corrector 203, for providing a clock signal labeled Fc. In one form, the frequency Fc is 48 MHz. Clock signal Fc is a high speed PWM quantization clock used to define the placement of the PWM edges of the digital pulse width modulated input signal X1 and X2. Similarly, clock signal Fc is used to define the placement of the PWM edges of the corrected digital pulse width modulated signals Y1 and Y2.

The output Y1, Y2 of digital pulse edge corrector 203 is connected to power stage 15 and provides a corrected digital pulse modulated signal as described with reference to FIG. 1. The output Z1, Z2 of power stage 15 provides an amplified pulse modulated output signal and is connected to a second input of integrating error amplifier 204. An output of mode control logic circuit 202 is applied as a fifth input to digital pulse edge corrector 203.

An output of order control logic 207 is applied to control an order of integrating error amplifier 204. In the disclosed exemplary embodiment, order control logic circuit 207 has two possible inputs, depending on a particular embodiment. In one embodiment, an input of order control logic 207 is provided from the output of ADC 206, and in another embodiment, an input to order control logic circuit 207 is provided from integrating error amplifier 204. The use of these two different inputs will be described in detail with reference to the state diagrams of FIGS. 11 and 12.

In operation, a digital correction signal provided by ADC 206 is applied to digital pulse edge corrector 203, which adjusts a timing of a rising edge, falling edge or both rising and falling edges of individual pulses in reference signals X1, X2 to produce corrected PWM signal Y1, Y2. In one embodiment, depending on the nature of the signal error represented by the digital correction signal provided by ADC 206, digital pulse edge corrector 203 will function to advance some digital pulse edges in time while other digital pulse edges will be delayed in time. In this manner, digital pulse edge corrector 203 functions to compensate for power supply noise and error and nonlinearity in power stage 15 by adjusting a timing of when one or both edges of each digital pulse occur, thus forming a discrete-time pulse edge correction. Depending upon a duty ratio of the digital pulse modulated input signal X1, X2, as determined by mode control logic circuit 202, the samples of the digital correction signal produced by ADC 206 are selected such that the time available for the delay through the power stage 15 and the analog-to-digital converter 206 is maximized. The ability to accommodate a larger delay allows the use of lower cost components for the power stage 15 as well as the use of existing off-the-shelf integrated power stages. In one particular embodiment, there are three different correction modes depending on whether the digital pulse modulated input signal has a low duty ratio, a medium duty ratio (close to 50%), or a high duty ratio. These three correction modes are presented below in more detail with reference to FIGS. 4–6.

Further, integrating error amplifier 204 is typically a multiple order integration amplifier. In one embodiment, integrating error amplifier 204 is a third order amplifier. The order control logic circuit 207 allows the order of the integration error amplifier 204 to be adjusted depending upon the saturation state of integrating error amplifier 204. In particular, and in accordance with one exemplary embodiment of the invention, the order of integrating error amplifier 204 may be lowered all the way down to first order. In addition, order control logic 207 allows the output of integrating error amplifier 204 to be set to zero for the purpose of a reset condition. In the event of a saturation event, as determined by order control logic 207, order control logic 207 reduces an order of integrating amplifier 204. Saturation may be detected in any number of ways, including, for example, by sensing the output of analog-to-digital converter 206, or by sensing the outputs of each of the individual integrating amplifiers within integrating error amplifier 204. When saturation is not detected by order control logic circuit 207, the order of integrating error amplifier 204 may be increased up to the maximum allowable order. This permits accommodation of large signal transients which allows the use of less margin in the duty ratios (which are fundamentally limited between zero and one). This, in turn, results in higher maximum power ratings for power stage 15 by permitting the output of power stage 15 to reach a level substantially equal to the power supply voltage, $V_{DD}$.

Figure 3:
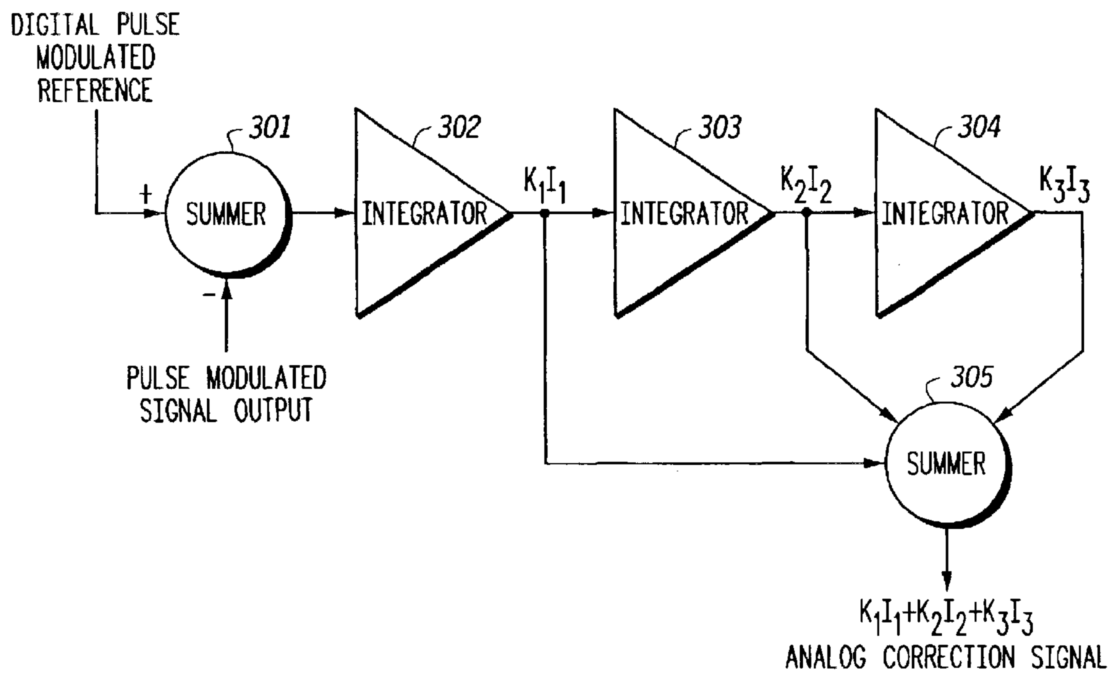
FIG. 3 is a block diagram of an integrating error amplifier usable in FIG. 2.

Referring now to FIG. 3, shown is a simplified block diagram of an example of integrating error amplifier 204. The clean PWM reference signal (provided by input digital pulse conditioner 201) is applied to the noninverting input of summer 301, and the PWM output (provided by power stage 15) is applied to the inverting input of summer 301. The output of summer 301 is applied to a series of integrating amplifiers 302, 303, and 304, and the respective outputs $K_1I_1$, $K_2I_2$, and $K_3I_3$ are applied to summer 305 which produces the analog correction signal, $K_1I_1+K_2I_2+K_3I_3$. It should be noted that the disclosed embodiment of integrating error amplifier 204 is simply one of several different types of structures that are acceptable. In addition, although a third order integrating error amplifier is disclosed, it will be appreciated that any multiple order amplifier would be acceptable. Further, the individual integrators and summers within integrating error amplifier 204 may be formed by various types of circuits, including, for example, differential amplifiers and/or operational amplifiers and accompanying circuitry, as is known in the art.

Referring now to FIGS. 4–7, presented are timing diagrams illustrating the operation of digital pulse edge corrector 203 under control of mode control logic 202. Each diagram shows positive and negative reference signals, X1, X2, positive and negative corrected output signals, Y1, Y2, and a reference ramp signal 401 used to illustrate timing. Also shown in each diagram is the timing of the samples used from ADC 206 to perform the correction. As may be seen with reference to FIGS. 4–7, the timing of the samples changes depending upon the correction mode as determined by mode control logic 202. The switching period, $T_S$, is represented by the time between the peaks of the reference ramp at times $(2n-1)T_S/2$ and $(2n+1)T_S/2$. As mentioned above, the sampling frequency of the ADC 206 is four times the switching frequency, $F_{SW}$, meaning that the sampling period is one quarter of the switching period, $T_S$. Thus, ADC 206 samples the analog correction signal produced by integrating error amplifier 204 at the beginning of the switching period at time $(2n-1)T_S/2$, and then at times $(2n-½)T_S/2$, $(2n)T_S/2$, $2n+½)T_S/2$ and finally at the period (the beginning of the next switching period) at time $(2n+1)T_S/2$. In accordance with the disclosed embodiment, different samples produced by ADC 206 are used by digital pulse edge corrector 203, as a function of the duty ratio of the digital PWM reference signal, X1, X2 as determined by mode control logic 202.

Figure 4:
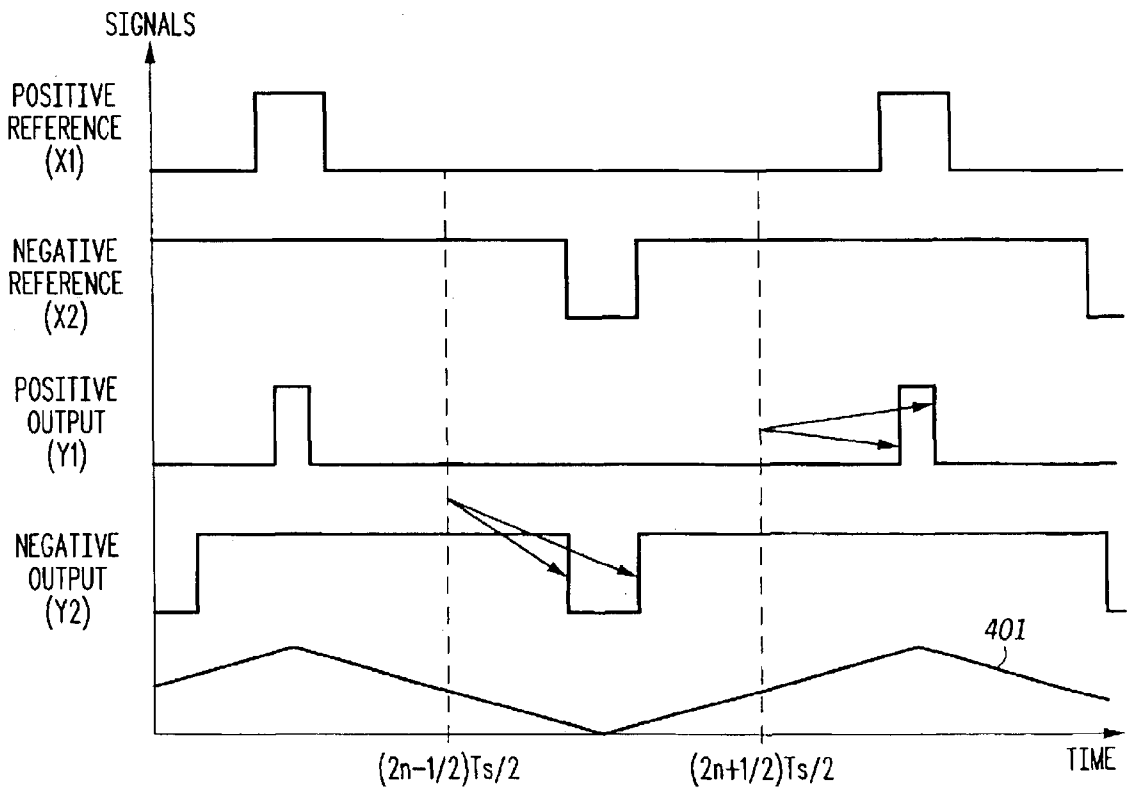
FIGS. 4–6 are timing diagrams illustrating different modes of operation for digital correction, in accordance with an aspect of the present invention.

Specifically, according to the exemplary disclosed embodiment, as shown in FIG. 4, if mode control logic 202 determines that a low duty ratio exists (Mode A), then the sample taken at time $(2n-½)T_S/2$ is used to correct both the falling and rising edges of the pulse width of the negative reference, X2, to produce corrected negative pulse, Y2, and the sample taken at time $(2n+½)T_S/2$ is used to correct both the rising and falling edges of the pulse width of the positive reference, X1, to produce corrected positive pulse, Y1. Referring to FIG. 5, if mode control logic 202 determines that a medium duty ratio exists (Mode B), then the sample taken at time $(2n-1)T_S/2$ is used to correct the falling edges of the pulse width of both the positive and negative references, X1, X2, and the sample taken at time $(2n)T_S/2$ is used to correct the rising edges of the pulse width of both the positive and negative references, X1, X2, to produce corrected positive and negative output pulses, Y1, Y2. Finally, referring to FIG. 6, if mode control logic 202 determines that a high duty ratio exists (Mode C), then the sample taken at time $(2n-½)T_S/2$ is used to correct both the falling and rising edges of the pulse width of the positive reference, X1, to produce corrected positive output pulse, Y1, and the sample taken at time $(2n+½)T_S/2$ is used to correct both the rising and falling edges of the pulse width of the negative reference, X2, to produce corrected negative output pulse, Y2.

In this manner, samples taken by ADC 206 near a switch transition that are likely to be noisy are not used for pulse correction, and only samples taken when there is no switch transition are used.

Figure 7:
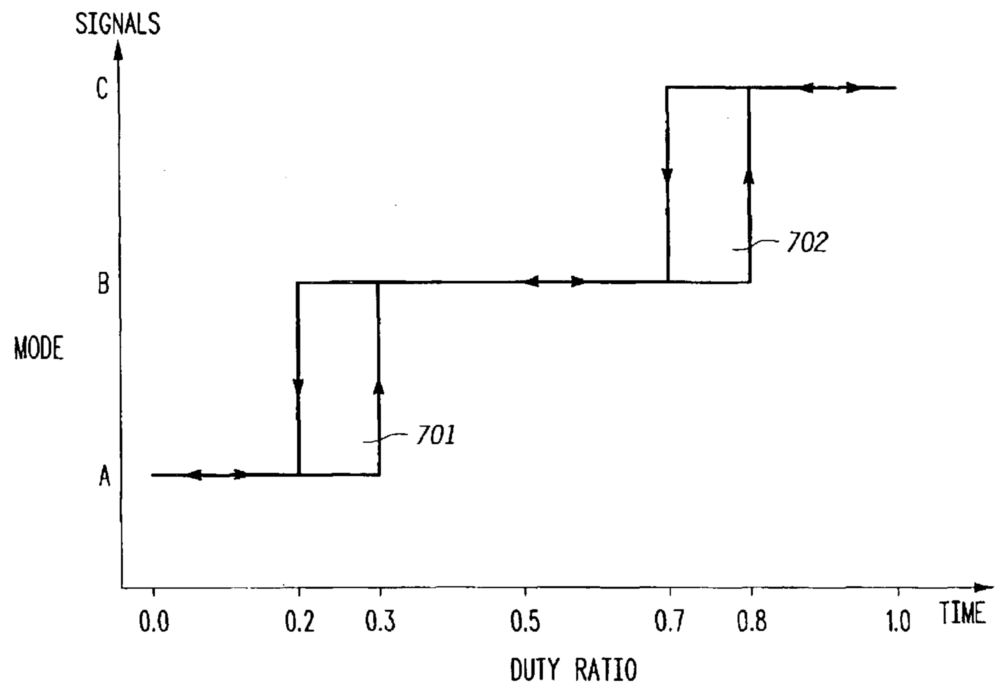
FIG. 7 is a graph of the transitions between the different correction modes, illustrated in FIGS. 4–6.

Turning now to FIG. 7, presented is a graph of an optional function of mode control logic 202 when determining correction mode from duty ratio. A benefit of this optional embodiment of mode control logic 202 is to maintain correction mode A for low duty ratios, correction mode B for medium duty ratios and correction mode C for high duty ratios, while at the same time minimizing unnecessary transitions between the correction modes. To accomplish this, hysteresis bands 701 and 702 are inserted at the transitions to reduce the number of mode changes. Hysteresis band 701 is inserted in the transition between mode A and mode B, and hysteresis band 702 is inserted in the transition between mode B and mode C.

Figure 8:
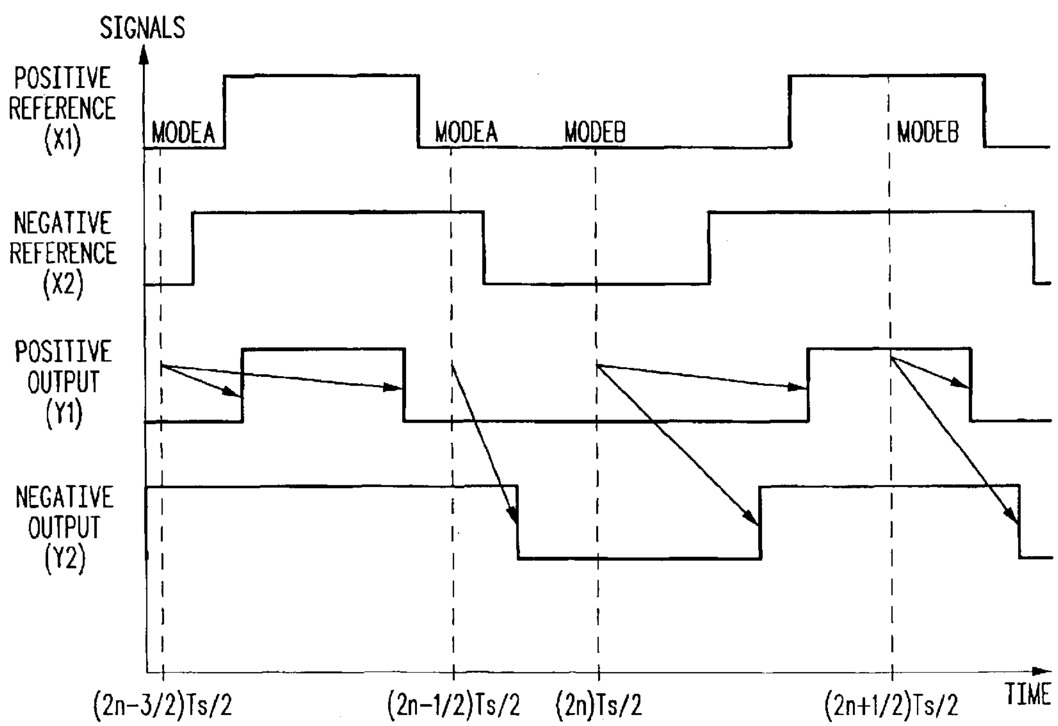
FIGS. 8 and 9 are additional timing diagrams showing correction mode transitions, in accordance with an aspect of the present invention.
Figure 9:
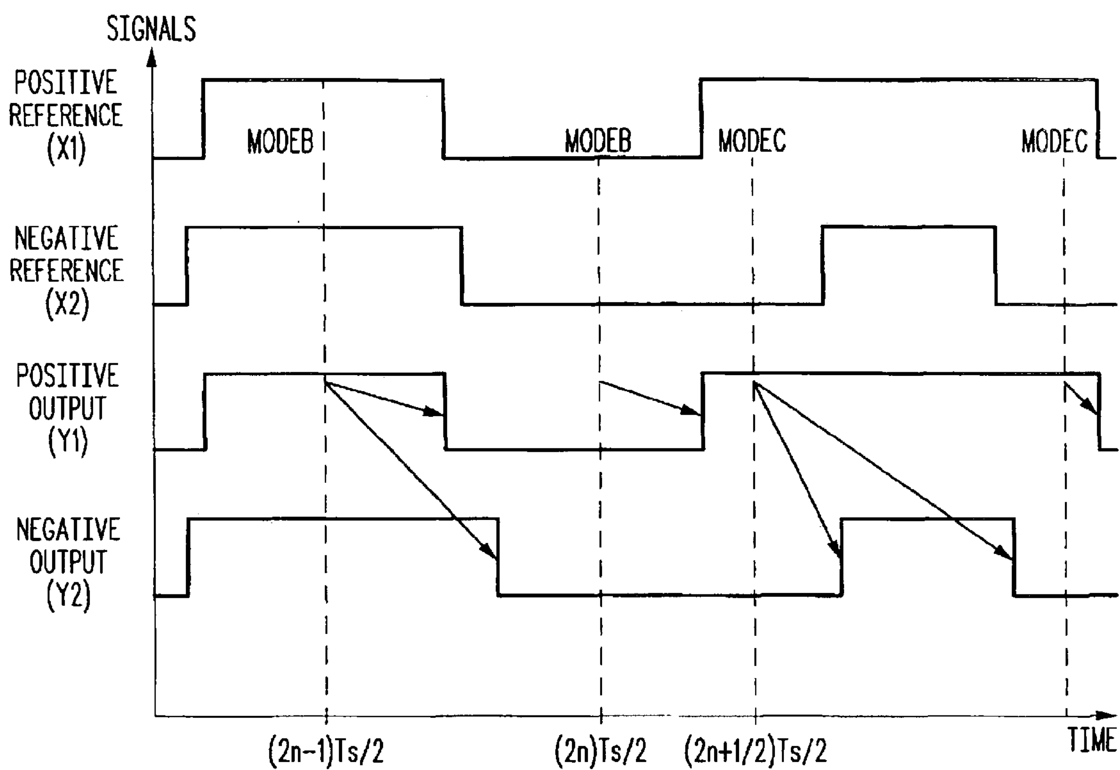

Another optional function of mode control logic 202 is to control digital pulse edge corrector 203 to provide smooth transitions between correction modes is shown in FIGS. 8 and 9. To smooth the transitions, additional samples are used during the transitions in order to ensure that no edges are left uncorrected. In FIG. 8, a transition between correction mode A and mode B is shown, and in order to ensure a smooth transition, the sample taken at time $(2n-½)T_S/2$ is used to correct only the falling edge of the negative reference signal, X2, to generate the falling edge of negative corrected signal, Y2, and the very next sample taken at time $(2n)T_S/2$ is used to correct the rising edge of the same signal, X2, to generate the rising edge of negative corrected signal, Y2. In FIG. 9, when transitioning from mode B to mode C, the sample taken at time $(2n)T_S/2$ is used to correct the rising edge of positive reference signal, X1, to generate the rising edge of positive corrected output signal, Y1, and the very next sample taken at time $(2n+½)T_S/2$ is used to correct both the rising and falling edges of negative reference signal, X2, to generate corrected output signal, Y2.

Figure 10:
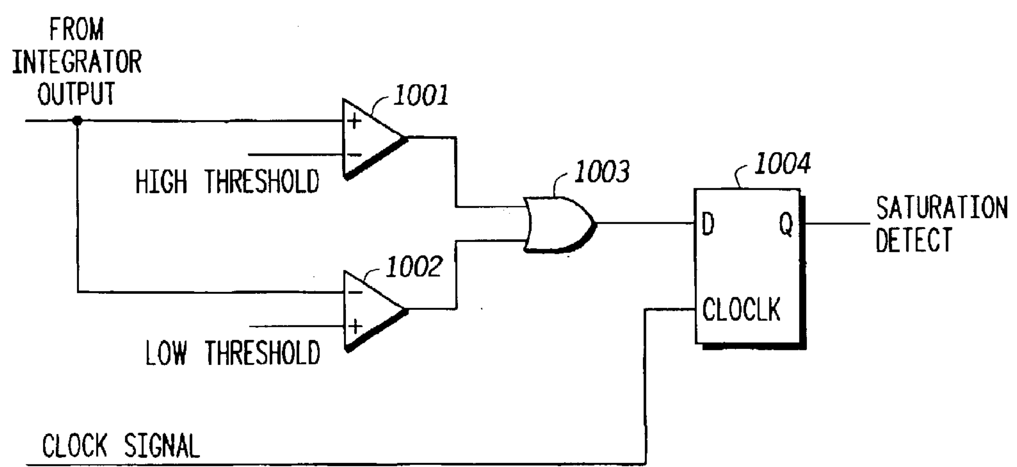
Figure 11:
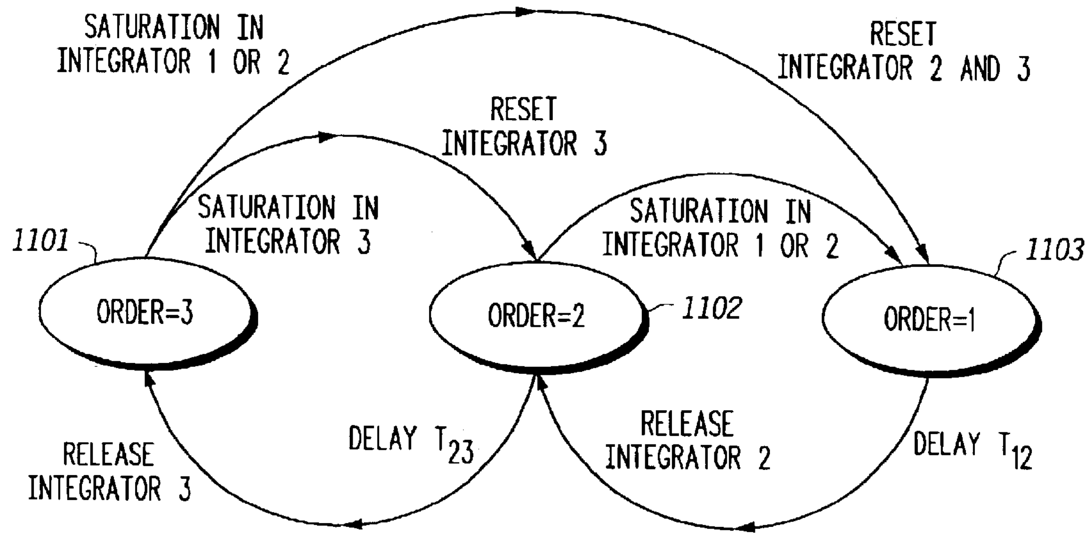
FIGS. 11 and 12 are state diagrams of the error amplifier order adjustment, in accordance with aspects of the present invention.

Turning now to FIGS. 10 and 11, presented is an exemplary embodiment of the operation of order control logic 207 (FIG. 2). FIG. 10 is a block diagram of an exemplary integrator saturation detector. In practice, the circuit of FIG. 10 may be repeated for each integrator so that the saturation state of each integrator may be sensed. For example, in the integrating error amplifier of FIG. 3, three integrator saturation detectors may be used, one connected to the output of each integrator 302, 303 and 304. Referring to FIG. 10, the output of the integrator being sensed is connected to the positive input of comparator 1001 and also to the negative input of comparator 1002. The negative input of comparator 1001 and the positive input of comparator 1002 are connected to appropriate thresholds so that comparator 1001 senses a high saturation state and comparator 1002 senses a low saturation state. The outputs of comparators 1001 and 1002 are applied to OR gate 1003, and the output of OR gate 1003 is applied to the D input of a D-type flip-flop 1004. A clock signal is also applied to flip-flop 1004. In operation, when the sensed integrator saturates in either a high state or a low state, for example, when the output of the integrator is substantially the same as the high or low supply voltage, then either the high or low saturation state comparators 1001, 1002 will transition, and will activate OR gate 1003. Flip-flop 1004 may be clocked using an appropriate clock signal to synchronize the saturation detector output with the rest of the system.

Turning now to FIG. 11, shown is a state diagram of the operation of order control logic 207. Beginning in state 1101, the integrating error amplifier is operating in its highest order, in this example, third order. If saturation of the third integrator is detected then a transition is made to state 1102 where the order of the integrating error amplifier is reduced to 2. Second order operation will continue until either saturation of the first or the second integrators is sensed, on which case a transition is made to state 1103 (first order operation), or a predetermined time expires, in which case a transition is made back to state 1101, and third order operation is continued.

If while in state 1101, saturation of the first or second integrators is detected, a transition is made from third order operation, state 1101, to first order operation, state 1103. In state 1103, if after a predetermined time no saturation events are detected, a transition is made to state 1102, and second order operation is resumed. If a predetermined time expires while in state 1102 without any saturation events being detected, a transition is made back to state 1101, and third order operation is resumed.

Figure 12:
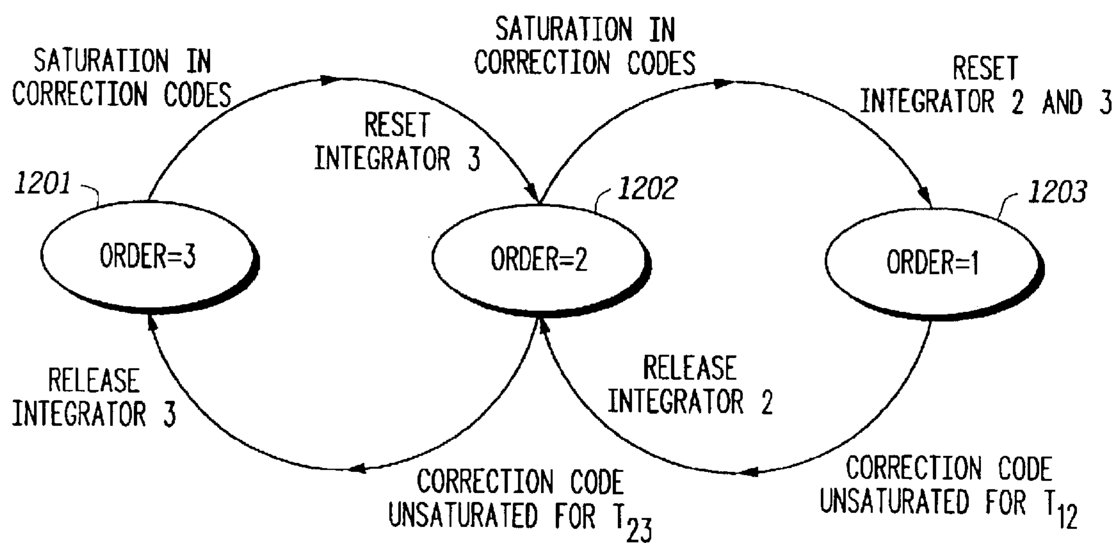

FIG. 12 presents a state diagram of an alternative embodiment of the operation of order control logic 207. In this embodiment, the saturation states of each individual integrator are not sensed, but rather, the output code of the ADC 206 is monitored to detect a saturation event. This may be done in a known manner, including sensing that the digital code produced by ADC 206 remains substantially constant for a predetermined time, or reaches a predetermined magnitude corresponding to integrator saturation. Beginning in state 1201, the integrating error amplifier 204 is operating as a third order integrator. If saturation is detected, a transition is made to state 1202, where second order operation is performed. If saturation continues to be sensed, a transition is made to state 1203 where first order operation is performed. If the digital code produced by ADC 206 indicated no saturation for a predetermined time, a transition is made back to state 1202, and second order operation is resumed. If no saturation is detected for another predetermined time, a transition is made back to state 1202 where third order operation is performed.

The invention may include a method and/or apparatus for adjusting the sample time and order associated with a digital correction system for maximizing output power and minimizing power stage delay sensitivity of a full bridge switching power stage. Presented are several different exemplary embodiments for performing these operations. As one of ordinary skill in the art will recognize in light of this disclosure, the methods contained herein may be implemented via hardware (for example, via an application specific integrated circuit), or via software.

Certain embodiments of the invention allow the sample point to be changed as a function of the duty ratio of the PWM signal thus allowing higher performance and use of less expensive power stage components. In addition, adjustment of the order of the integrating error amplifier permits operation of the power stage with an output swing up to the power supply rails, thus increasing a power output of the power stage. One of ordinary skill in the art will recognize in light of this disclosure that the invention includes applications ranging from audio amplifiers to motor control.

The terms a or an, as used herein, are defined as one or more than one. The term plurality or multiple, as used herein, is defined as two or more than two. The terms including and/or having, as used herein, are defined as comprising (i.e., open language). The term coupled, as used herein, is defined as connected, although not necessarily directly, and not necessarily mechanically.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

What is claimed is:

1. A switching amplifier, comprising:

a power stage having an input and an output, the output providing an amplified pulse modulated output signal; and a digital correction circuit having a first input for receiving a pulse modulated input signal, a second input coupled to the output of the power stage, and an output coupled to the input of the power stage; the digital correction circuit providing a corrected pulse modulated signal to the input of the power stage, and having multiple correction modes dependent upon a duty ratio of said pulse modulated input signal.

2. The switching amplifier of claim 1, the digital correction circuit performing, in each correction mode, a discrete-time pulse edge correction on at least one of a leading edge and a trailing edge of the pulse modulated input signal to provide the corrected pulse modulated signal.

3. The switching amplifier of claim 1, the digital correction circuit further comprising, an analog to digital converter having an input coupled to the output of the power stage and an output providing a digital correction signal, a sampling time of the analog to digital converter changing as a function of said duty ratio.

4. The switching amplifier of claim 1, the digital correction circuit further providing for smooth transitions between said multiple correction modes.

5. The switching amplifier of claim 1, the digital correction circuit further comprising:

an error amplifier having a fist input for receiving a pulse modulated reference signal, and a second input for receiving the output of the power stage, and an output for providing an analog correction signal;

an analog to digital convener coupled to the error amplifier for converting the analog correction signal into a digital correction signal; and a digital pulse edge corrector having a first input connected to the output of the analog-to-digital converter, a second input for receiving the pulse modulated input signal and an output coupled to the input of the power stage.

6. The switching amplifier of claim 5, the analog to digital converter having a controllable sampling time that varies as a function of said duty ratio.

7. The switching amplifier of claim 5, the error amplifier comprising a multiple order error amplifier.

8. The switching amplifier of claim 7, further comprising:

an error amplifier saturation detector for sensing a saturation state of said error amplifier, and for adjusting an order of said error amplifier as a function of said saturation state.

9. A method for correcting nonlinearities in a switching amplifier, comprising:

amplifying a pulse modulated input signal to produce an amplified pulse modulated output signal;

comparing said amplified pulse modulated output signal with a pulse modulated reference signal to produce an error signal;

integrating said error signal using a multiple order integration process;

sensing a saturation state of said multiple order integration process;

adjusting an order of said multiple order integration process as a function of a saturation state; and correcting said digital pulse modulated input signal as a function of the error signal, and as a function of a duty ratio of said digital pulse modulated input signal.

10. A switching amplifier, comprising:

a power stage having an input and an output, the output providing an amplified pulse width modulated output signal;

a multiple-order controllable error amplifier having a first input for receiving a digital pulse width modulated reference input signal, a second input coupled to the output of the power stage, and an output providing an error signal;

an order control unit coupled to receive the error signal, for sensing a saturation state of the error amplifier, and for adjusting an order of the error amplifier as a function of the saturation state;

a correction circuit having an input coupled to receive the error signal and an output coupled to the input of the power stage, the correction circuit providing a pulse width modulated signal to the input of the power stage as a function of the error signal.

11. The switching amplifier of claim 10, the power stage comprising a half bridge power stage.

12. The switching amplifier of claim 10, the power stage comprising a full bridge power stage.

13. The switching amplifier of claim 12, the power stage including a power supply, the output of the power stage being permitted to saturate to a level of the power supply.

14. A method for correcting nonlinearities in a switching amplifier, comprising:

amplifying a pulse modulated input signal to produce an amplified pulse modulated output signal;

comparing said amplified pulse modulated output signal with a pulse modulated reference signal to produce an error signal;

integrating said error signal using a multiple order integration process;

sensing a saturation state of said multiple order integration process;

adjusting an order of said multiple order integration process as a function of said saturation state; and adjusting said pulse modulated input signal as a function of the error signal.

15. The method of claim 14, further comprising:

correcting said pulse modulated input signal as a function of a duty ratio of said pulse modulated input signal.

* * * * *

UNITED STATES PATENT AND TRADEMARK OFFICE

CERTIFICATE OF CORRECTION

PATENT NO. : 6,922,100 B2
DATED : July 26, 2005
INVENTOR(S) : Midya et al.

It is certified that error appears in the above-identified patent and that said Letters Patent is hereby corrected as shown below:

Column 9,
Line 44, please delete “fist” and insert -- first --.

Column 10,
Line 32, after “state;” please insert -- and --.

Signed and Sealed this

Twenty-second Day of November, 2005

JON W. DUDAS
*Director of the United States Patent and Trademark Office*